(12) United States Patent
Chung

(10) Patent No.: US 7,863,736 B2
(45) Date of Patent: Jan. 4, 2011

(54) SEMICONDUCTOR DEVICE AND SIGNAL TERMINATING METHOD THEREOF

(75) Inventor: Dae-Hyun Chung, Daegeon (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 534 days.

(21) Appl. No.: 12/007,322

(22) Filed: Jan. 9, 2008

(65) Prior Publication Data
US 2008/0169536 A1 Jul. 17, 2008

(30) Foreign Application Priority Data

Jan. 12, 2007 (KR) .................. 10-2007-0003829

(51) Int. Cl.
*H01L 23/50* (2006.01)
(52) U.S. Cl. .................. 257/724; 257/531; 257/533; 257/528; 257/536; 257/E27.016
(58) Field of Classification Search .................. 257/724, 257/531, 533, 528, 536, E27.016
See application file for complete search history.

(56) References Cited

U.S. PATENT DOCUMENTS

| 4,800,418 | A | * | 1/1989 | Natsui ..................... 327/564 |
| 4,926,234 | A | * | 5/1990 | Katoh ...................... 257/48 |
| 5,195,045 | A | | 3/1993 | Keane et al. |
| 5,412,235 | A | * | 5/1995 | Nakajima et al. .......... 257/272 |
| 5,952,896 | A | | 9/1999 | Mett et al. |
| 6,381,164 | B1 | | 4/2002 | Fan et al. |
| 6,423,981 | B1 | * | 7/2002 | Nayler ..................... 257/48 |
| 2006/0133055 | A1 | * | 6/2006 | Uematsu et al. ........... 361/760 |
| 2007/0030024 | A1 | | 2/2007 | Lee et al. |
| 2010/0079246 | A1 | * | 4/2010 | Mikalo ..................... 340/10.1 |
| 2010/0155886 | A1 | * | 6/2010 | Kim ........................ 257/531 |

FOREIGN PATENT DOCUMENTS

| JP | 10-294636 | 11/1998 |
| JP | 10-303675 | 11/1998 |
| JP | 2000-307410 | 11/2000 |
| KR | 10-0660873 B1 | 12/2006 |

* cited by examiner

*Primary Examiner*—Eugene Lee
(74) *Attorney, Agent, or Firm*—Lee & Morse, P.C.

(57) ABSTRACT

A semiconductor device may include a semiconductor chip including a signal terminating resistor coupled between a signal input pad and a first ground voltage pad, a semiconductor package including a signal input terminal and a first ground voltage terminal, the signal input terminal being electrically coupled to the signal input pad of the semiconductor chip and the first ground voltage terminal being electrically coupled to the first ground voltage pad of the semiconductor chip, a capacitor and a resistor that are coupled between the signal input terminal and the first ground voltage terminal, and a first inductor realized by coupling the signal input terminal and the signal input pad.

20 Claims, 4 Drawing Sheets

SEMICONDUCTOR DEVICE AND SIGNAL TERMINATING METHOD THEREOF

BACKGROUND OF THE INVENTION

1. Field of the Invention

Embodiments of the invention relate to a semiconductor device, and more particularly, to a semiconductor device including a signal terminating circuit for terminating an externally applied signal.

2. Description of the Related Art

A typical semiconductor device includes a terminating resistor inside a chip that is adapted to terminate an externally applied signal in order to prevent a signal from being reflected. Further, ideally, input impedance Zin of a semiconductor device, i.e., impedance of a semiconductor device from a standpoint of looking into an input thereof, would be constant, irrespective of operating frequency. However, in general, as a result of parasitic inductance and/or parasitic capacitance, input impedance Zin of semiconductor devices changes based on changes in frequency. Accordingly, it is difficult to stably terminate a signal(s).

SUMMARY OF THE INVENTION

Embodiments of the invention are therefore directed to a semiconductor device and a signal terminating method thereof, which substantially overcome one or more of the problems due to the limitations and disadvantages of the related art.

It is therefore a feature of an embodiment of the invention to provide a semiconductor device in which a signal may be stably terminated when a high speed signal is transmitted thereto.

It is therefore a separate feature of an embodiment of the invention to provide a signal terminating method of a semiconductor device in which a signal is stably terminated when a high speed signal is transmitted thereto.

At least one of the above and other features and advantages of the invention may provide a semiconductor device, including a semiconductor chip including a signal terminating resistor coupled between a signal input pad and a first ground voltage pad, a semiconductor package including a signal input terminal and a first ground voltage terminal, the signal input terminal being electrically coupled to the signal input pad of the semiconductor chip and the first ground voltage terminal being electrically coupled to the first ground voltage pad of the semiconductor chip, a capacitor and a resistor that are coupled between the signal input terminal and the first ground voltage terminal, and a first inductor realized by coupling the signal input terminal and the signal input pad.

The capacitor and the resistor may be included in the semiconductor package. A wire bond may couple the signal input terminal and the signal input pad. The semiconductor chip may include an input capacitor between the signal input pad and the first ground voltage pad. The semiconductor device may include a second inductor realized by coupling the first ground voltage terminal and the first ground voltage pad. A wire bond may couple the first ground voltage terminal and the first ground voltage pad.

An inductance of the first inductor may be smaller than an inductance of the second inductor. The input impedance of the semiconductor device may decrease from a value of the terminating resistor as a frequency increases to a first resonant frequency by the input capacitor and the second inductor, increase as the frequency increases from the first resonant frequency to a second resonant frequency by the capacitor and the second inductor, and decrease before maintaining a completely and/or substantially constant value corresponding to the value of the resistor as the frequency increases after the second resonant frequency.

The semiconductor chip may further include a signal input portion adapted to receive a signal applied to the signal input pad, and the semiconductor package may include a second ground voltage terminal, and a third inductor that may be realized by coupling the signal input portion and the second ground voltage terminal. A wire bond may couple the signal input portion and the second ground voltage terminal. Capacitance of the capacitor may be smaller than capacitance of the input capacitor.

At least one of the above and other features and advantages of the invention may provide a signal terminating method of a semiconductor device including a semiconductor chip and a semiconductor package, the semiconductor chip including a signal terminating resistor coupled between a signal input pad and a first ground voltage pad, the semiconductor package including a signal input terminal and a first ground voltage terminal, the signal terminating method including realizing a first inductor by coupling the signal input terminal and the signal input pad, and serially connecting a capacitor and a resistor between the signal input terminal and the first ground voltage terminal.

The method may further include realizing a second inductor by coupling the first ground voltage pad of the semiconductor chip and the first ground voltage terminal of the semiconductor package. The method may further include providing an input capacitor between the signal input pad and the first ground voltage pad. The capacitor may have a smaller capacitance value than the input capacitor.

The input impedance of the semiconductor device may decrease from a value of the terminating resistor as a frequency increases to a first resonant frequency by the input capacitor and the second inductor, increase as the frequency increases from the first resonant frequency to a second resonant frequency by the capacitor and the second inductor, and decrease before maintaining a completely and/or substantially constant value corresponding to the value of the resistor as the frequency increases after the second resonant frequency.

The method may further include increasing an inductance value of the second inductor, wherein an inductance of the first inductor may be smaller than an inductance of the second inductor. The capacitor and the resistor may be included in the semiconductor package.

BRIEF DESCRIPTION OF THE DRAWINGS

The above and other features and advantages of the present invention will become more apparent to those of ordinary skill in the art by describing in detail exemplary embodiments thereof with reference to the attached drawings, in which.

DETAILED DESCRIPTION OF THE INVENTION

Figure 1:
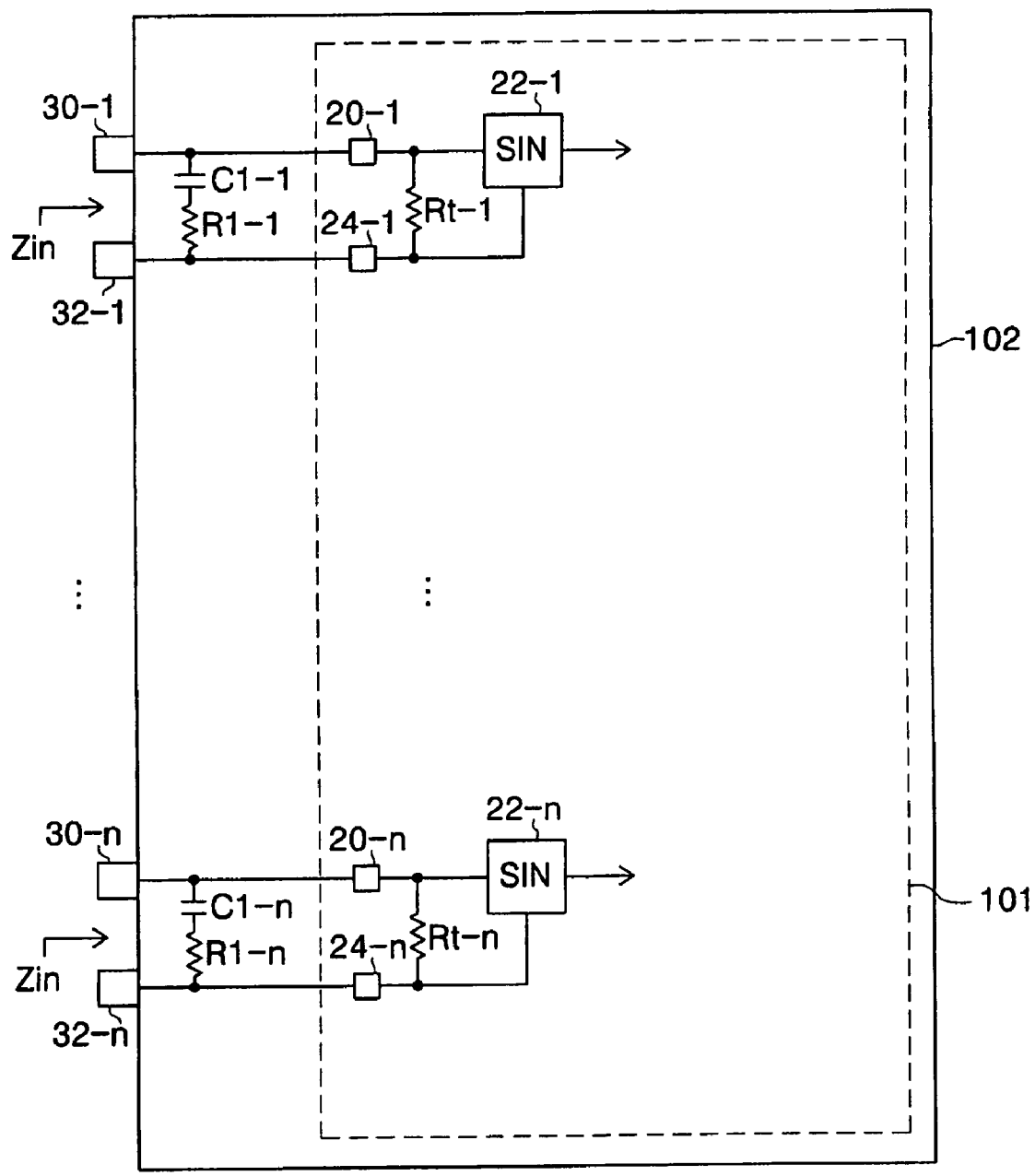
FIG. 1 illustrates a circuit diagram of a semiconductor device according to an exemplary embodiment of the present invention.

Korean Patent Application No. 10-2007-0003829, filed Jan. 12, 2007, in the Korean Intellectual Property Office, and entitled: "Semiconductor Device and Signal Terminating Method Thereof," is incorporated by reference herein in its entirety.

Embodiments of the present invention will now be described more fully hereinafter with reference to the accompanying drawings, in which exemplary embodiments of the invention are illustrated. Aspects of the invention may, however, be embodied in different forms and should not be construed as limited to the embodiments set forth herein. Rather, these embodiments are provided so that this disclosure will be thorough and complete, and will fully convey the scope of the invention to those skilled in the art.

It will be understood that when an element is referred to as being "coupled to" another element, unless set forth otherwise, the element may be directly coupled, and one or more intervening elements may also be present. In addition, it will also be understood that when an element is referred to as being "between" two elements, it may be the only element between the two elements, or one or more intervening elements may also be present. Like reference numerals refer to like elements throughout the specification.

FIG. 1 illustrates a circuit diagram of a semiconductor device 100, e.g., a semiconductor memory device, according to an exemplary embodiment of the present invention. The semiconductor device 100 of FIG. 1 may include a semiconductor chip 101 and a semiconductor package 102. The semiconductor device 100 may be coupled to a printed circuit board PCB (not illustrated) and/or the semiconductor package 102 may itself include a PCB (not illustrated).

The semiconductor chip 101 may include signal input pads 20-1 to 20-$n$, ground voltage pads 24-1 to 24-$n$, terminating resistors Rt-1 to Rt-n, and signal input portions SIN 22-1 to 22-$n$, where n may be any integer. The semiconductor package 102 may include signal input pins 30-1 to 30-$n$, ground voltage pins 32-1 to 32-$n$, capacitors C1-1 to C1-$n$, and resistors R1-1 to R1-$n$. As described above, in some embodiments, the semiconductor package 102 may include a PCB (not illustrated).

In some embodiments, the signal input pins 30-1 to 30-$n$ of the semiconductor package 102 may be coupled, e.g., to signal input pads (or terminals, not illustrated) of the PCB (not illustrated) of the semiconductor pad 102, respectively. The ground voltage pads 24-1 to 24-$n$ of the semiconductor package 102 may be coupled, e.g., to ground voltage pads (or terminals, not illustrated) of the PCB of the semiconductor package 102.

The terminating resistors R1-1 to R1-$n$ may be respectively coupled between the corresponding signal input pads 20-1 to 20-$n$ and the ground voltage pads 24-1 to 24-$n$ of the semiconductor chip 101. Each of the capacitors C1-1 to C1-$n$ and the corresponding one of the resistors R1-1 to R1-$n$ may be respectively coupled in series between the corresponding signal input pads 20-1 to 20-$n$ and the ground voltage pins 32-1 to 32-$n$ of the semiconductor package 102. In embodiments, coupling of the signal input pads 20-1 to 20-$n$ with the respective signal input pin 30-1 to 30-$n$ and coupling of the ground voltage pads 24-1 to 24-$n$ with the respective ground voltage pin 32-1 to 32-$n$ may be realized by wire bonding.

The capacitors C1-1 to C1-$n$ and the resistors R1-1 to R1-$n$ may be coupled to the PCB. The capacitors C1-1 to C1-$n$ may be realized by a capacitor integrated chip. The resistors R1-1 to R1-$n$ may be realized by a resistor integrated chip.

Figure 2:
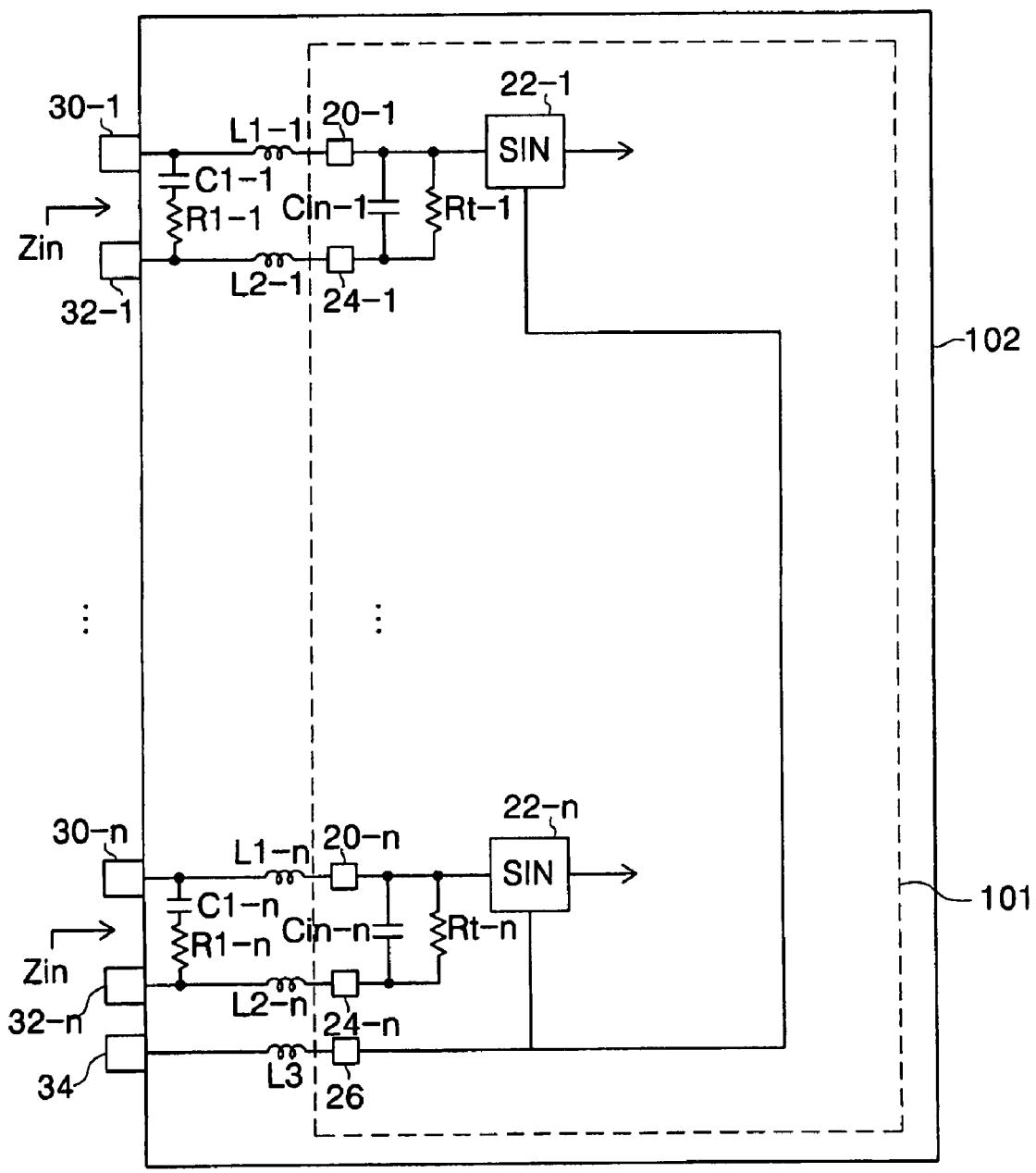
FIG. 2 illustrates a circuit diagram of an equivalent circuit model of the semiconductor device of FIG. 1.

FIG. 2 illustrates a circuit diagram of an equivalent circuit model of the semiconductor device 100 of FIG. 1. Referring to FIG. 2, in some embodiments, the semiconductor package 102 may further include a ground voltage pin 34, and the semiconductor chip 101 may further include a ground voltage pad 26. Further, the semiconductor device 100 may inherently include inductors L1-1 to L1-$n$, inductors L2-1 to L2-$n$, an inductor L3 and capacitors Cin-1 to Cin-n. That is, e.g., the inductors L1-1 to L1-$n$, L2-1 to L2-$n$ and L3 may be an inherent result of electrical/parasitic characteristics of, e.g., wire bonding coupling respective elements of the semiconductor device 100. That is, e.g., inductance of the inductors L1-1 to L1-$n$ may correspond to inductance of wire coupling a respective one of the signal input pins 30-1 to 30-$n$ to the corresponding one of the signal input pads 20-1 to 20-$n$, and may not be realized by, e.g., an inductor in the form of a chip. More particularly, inductance of the inductors L2-1 to L2-$n$ may correspond to inductance of wire coupling a respective one of the ground voltage pins 32-1 to 32-$n$ and the corresponding one of the ground voltage pads 24-1 to 24-$n$. Inductance of the inductor L3 may correspond to inductance of wire coupling the ground voltage pin 34 and the ground voltage pad 26. Capacitance of the capacitors Cin-1 to Cin-n may correspond to an inherent/parasitic capacitance between a respective one of the signal input pads 20-1 to 20-$n$ and the corresponding one of the ground voltage pads 24-1 to 24-$n$.

A respective one of the inductors L1-1 to L1-$n$ may be between each of the signal input pins 30-1 to 30-$n$ and the corresponding one of the signal input pads 20-1 to 20-$n$. A respective one of the inductors L2-1 to L2-$n$ may be between each of the ground voltage pins 32-1 to 32-$n$ and the corresponding one of the ground voltage pads 24-1 to 24-$n$. The inductor L3 may be between the ground voltage pin 34 and the ground voltage pad 26. A respective one of the capacitors Cin-1 to Cin-n may be between each of the signal input pads 20-1 to 20-$n$ and the corresponding one of the ground voltage pads 24-1 to 24-$n$ of the semiconductor chip 101.

Further, referring to FIG. 2, if, e.g., the inductance value of the inductor(s) L2-1 to L2-$n$ is increased, a ground voltage of the signal input portions 22-1 to 22-$n$ may be unstable. Therefore, as illustrated in FIG. 2, in some embodiments, a ground voltage may be supplied to the signal input portions 22-1 to 22-$n$ via the ground voltage pin 34 and the ground voltage pad 26. That is, in some embodiments, the ground voltage pin 34 may supply a ground voltage to the signal input portions 22-1 to 22-$n$, while the ground voltage pins 32-1 to 32-$n$ and the ground voltage pads 24-1 to 24-$n$ may supply a ground voltage to a terminal of the respective resistors R1-1 to R1-$n$. However, embodiments of the invention are not limited thereto, and as discussed above, may not include the ground voltage pin 34 and the ground voltage pad 26. In such cases, e.g., the ground voltage pads 24-1 to 24-$n$ may be coupled to the respective signal input portions 22-1 to 22-$n$.

In view of the circuit model of the semiconductor device 100 illustrated in FIG. 2, in some embodiments, an input impedance Zin of the semiconductor device may vary based on frequency as a result of, e.g., the inherent/parasitic capacitance Cin-1 to Cin-n and/or the inherent/parasitic inductors L1-1 to L1-$n$, L2-1 to L2-$n$.

In embodiments, by providing the capacitors C1-1 to C1-$n$ and the resistors R1-1 to R1-$n$ as described above, variation of the input impedance Zin generated by circuit parasitics, e.g., the corresponding one of capacitors Cin-1 to Cin-n and the corresponding one of the inductors L1-1 to L1-$n$ while the semiconductor device 100 operates in a relatively low frequency region may be offset by the corresponding one of the capacitors C1-1 to C1-$n$ and the corresponding one of the resistors R1-1 to R1-$n$. Thus, in embodiments, the respective input impedance Zin may achieve a constant and/or substantially constant value of the corresponding one of the resistors R1-1 to R1-$n$ at a frequency greater than a predetermined frequency. As a result, in embodiments, signal termination may be stably performed even when a high speed signal is applied to the respective signal input portion 22-1 to 22-$n$ of the semiconductor device 100.

More particularly, in some embodiments, by increasing, e.g., an inductance value of the respective one of the inductors L1-1 to L1-$n$, the respective input impedance Zin may be substantially and/or completely stabilized at least after a predetermined frequency as a result of, e.g., the respective resistor R1-1 to R1-$n$ and the respective capacitor C1-1 to C1-$n$. Referring to FIGS. 1 and 2, in some embodiments, the semiconductor device 100 may be implemented so as to adjust, e.g., increase, the inductance value, e.g., the inductance of the corresponding one of the inductors L1-1 to L1-$n$, resulting from the wire bonding between the signal input terminals (or pads, not illustrated) of the PCB of the semiconductor package 102 and the corresponding one of the signal input pads 20-1 to 20-$n$ of the semiconductor chip 101 to thereby help stabilize the respective input impedance Zin to a value of the corresponding one of the resistors R1-1 to R1-$n$.

However, if the inductance value of the respective inductor(s) L1-1 to L1-$n$ is increased too much, signal integrity may be compromised as a result of, e.g., signal distortion of the signal passing through the respective inductor L1-1 to L1-$n$. Therefore, in some embodiments, to avoid increasing the inductance of the inductor L1-1 to L1-$n$ too much, an inductance the inductors L2-1 to L2-$n$, which may be, e.g., inherently/parasitically included, may be increased while the inductance of the corresponding inductors L1-1 to L1-$n$ may be maintained or reduced. Accordingly, in some embodiments, e.g., the respective input impedance Zin may be stabilized to a value of the corresponding one of the resistors R1-1 to R1-$n$ at a lower predetermined frequency than a case in which, e.g., the corresponding one of the resistors R1-1 to R1-$n$, the corresponding one of the capacitors C1-1 to C1-$n$ and/or the inductors L2-1 to L2-$n$ are not included in the semiconductor device 100 and/or a case in which the inductance of the respective inductor L2-1 to L2-$n$ is maintained relatively low.

Further, if the inductance value of the inductors L2-1 to L2-$n$ resulting from, e.g., wire bonding between the voltage terminals (or pads, not illustrated) of the PCB of the semiconductor package 102 and the ground voltage pads 24-1 to 24-$n$ of the semiconductor chip 101 are adjusted to be too large, because a ground voltage of the signal input portions 22-1 to 22-$n$ may be unstable, in some embodiments, another ground voltage supply (not illustrated) may be applied to the signal input portions 22-2 to 22-$n$ via, e.g., the ground voltage pin 34 and the ground voltage pad 26. As discussed above, inductance of the inductor L3 may correspond to inductance of wire coupling the ground voltage pin 34 and the ground voltage pad 26.

In some embodiments, the capacitors C1-1 to C1-$n$ may have a smaller capacitance than the corresponding one of the capacitors Cin-1 to Cin-n and the corresponding one of the inductors L1-1 to L1-$n$ may have a much smaller inductance than the corresponding inductor L2-1 to L2-$n$.

Referring to FIG. 2, series resonance may occur among the respective capacitor Cin-1 to Cin-n and the corresponding one of the inductors L2-1 to L2-$n$ and parallel resonance may occur among the respective capacitor C1-1 to C1-$n$ and the corresponding one of the inductors L2-1 to L2-$n$. Thus, there may be two resonant frequencies.

If the respective capacitor Cin-1 to Cin-n has a larger capacitance than the corresponding one of the capacitors C1-1 to C1-$n$ and the corresponding one of the inductors L1-1 to L1-$n$ has a much smaller inductance than the corresponding one of the inductors L2-1 to L2-$n$, series resonance may first occur among the respective capacitor Cin-1 to Cin-n and the corresponding inductor L2-1 to L2-$n$ that are serially connected, and a series resonant frequency fo1 may correspond to $$\frac{1}{2\pi\sqrt{L2Cin}}.$$

Thereafter, parallel resonance may occur among the respective capacitor C1-1 to C1-$n$ and the corresponding one of the inductors L2-1 to L2-$n$ that are connected in parallel, and a parallel resonant frequency fo2 may correspond to $$\frac{1}{2\pi\sqrt{L2C1}}.$$

However, if the respective inductor L1-1 to L1-$n$ has a larger inductance than the corresponding inductor L2-1 to L2-$n$, the resonant frequencies fo1 and fo2 may be determined by the inductance value of the respective inductor L1-1 to L1-$n$.

Figure 3:
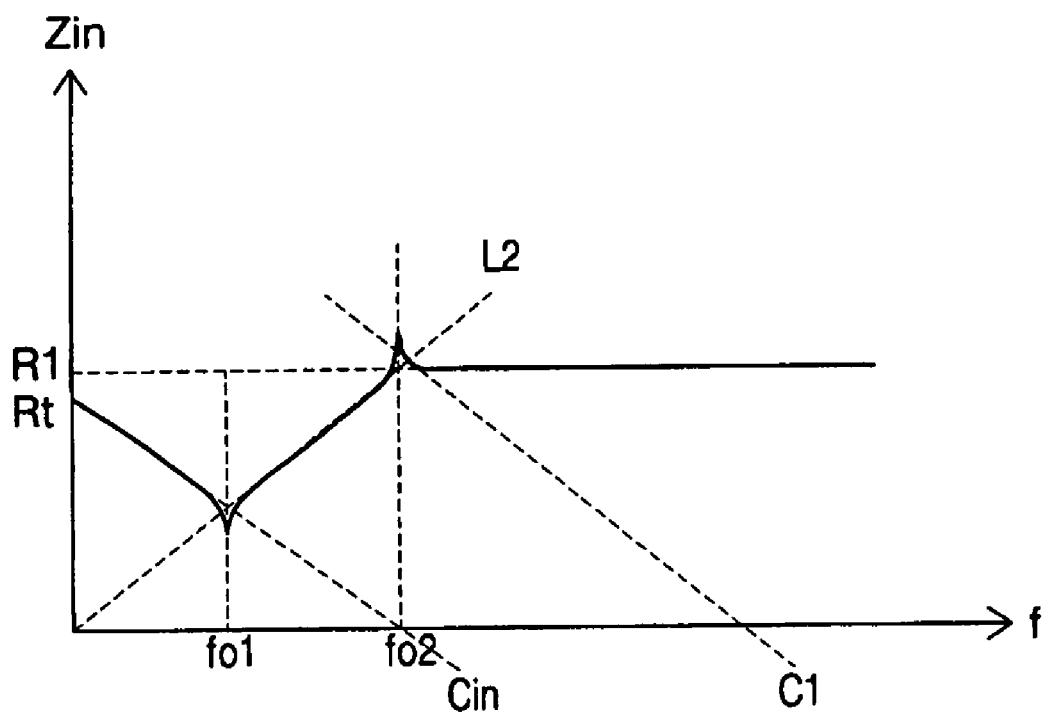
FIG. 3 illustrates a graph illustrating change in input impedance relative to frequency of the semiconductor device of FIG. 2.

FIG. 3 illustrates a graph illustrating change in input impedance Zin relative to frequency f of the semiconductor device 100 of FIG. 2.

Referring to FIG. 3, in a frequency range that is lower than the series resonant frequency fo1, as a result of the change in capacitance of the respective capacitor Cin-1 to Cin-n as the frequency increases, the input impedance Zin may slowly decrease from a value of the respective terminating resistor R1-1 to R1-$n$ until series resonance occurs among the respective capacitor Cin-1 to Cin-n and the corresponding one of the inductors L2-1 to L2-$n$ at the series resonant frequency fo1. More particularly, referring to FIG. 3, in the frequency range that is lower than the series resonant frequency fo1, impedance of the respective capacitor Cin-1 to Cin-n may decrease while impedance of the respective inductor L2-1 to L2-$n$ increases until the series resonant frequency fo1 is reached, and the overall impedance thereof is reduced from a value corresponding to the respective terminal resistor Rt-1 to Rt-n.

In a frequency range that is higher than the series resonant frequency fo1 and lower than the parallel resonant frequency fo2, as a result of the change in capacitance of the respective inductor L2-1 to L2-$n$ as the frequency increases, the input impedance Zin may slowly increase. Parallel resonance may occur among the respective capacitor C1-1 to C1-$n$ and the corresponding inductor L2-1 to L2-$n$ at the parallel resonant frequency fo2. More particularly, referring to FIG. 3, in the frequency range that is lower than the series resonant frequency fo1, impedance of the respective inductor L2-1 to L2-$n$ may continue to increase while impedance of the respective capacitor Cin-1 to Cin-n may continue decrease until the parallel resonant frequency fo2 is reached, and the overall impedance thereof is increased to a value higher than a value corresponding to the respective resistor R1-1 to R1-$n$.

If the frequency is increased beyond the parallel resonant frequency fo2, as a result of the capacitance of the respective capacitor C1-1 to C1-$n$, the input impedance Zin may initially decrease from a value higher than the resistance of the respective resistor R1-1 to R1-$n$ before completely and/or substantially stabilizing at a value corresponding to the respective resistor R1-1 to R1-$n$ as a result of the resistance thereof. More particularly, referring to FIG. 3, in the frequency range which is higher than the parallel resonant frequency fo2, impedance of the respective inductor L2-1 to L2-$n$ may continue to increase while impedance of the respective capacitor C1-1 to C1-$n$ may continue decrease until the overall impedance thereof is substantially and/or completely stabilized to a value corresponding to the respective resistor R1-1 to R1-$n$.

Thus, embodiments may provide a semiconductor device that may stably terminate a signal because input impedance Zin may maintain a constant and/or substantially constant value of a resistor R1 when a high speed input signal is applied.

Referring to the graph of FIG. 3, in embodiments, the parallel resonant frequency fo2 may be reduced, by increasing the value of the inductor L2.

However, in some embodiments, as discussed above, if input impedance Zin may be substantially and/or completely stabilized, i.e., made substantially and/or completely constant, by way of the respective inductor L1-1 to L1-$n$ and without the respective inductor L2-1 to L2-$n$, the respective inductor L2-1 to L2-$n$ may be omitted.

Figure 4:
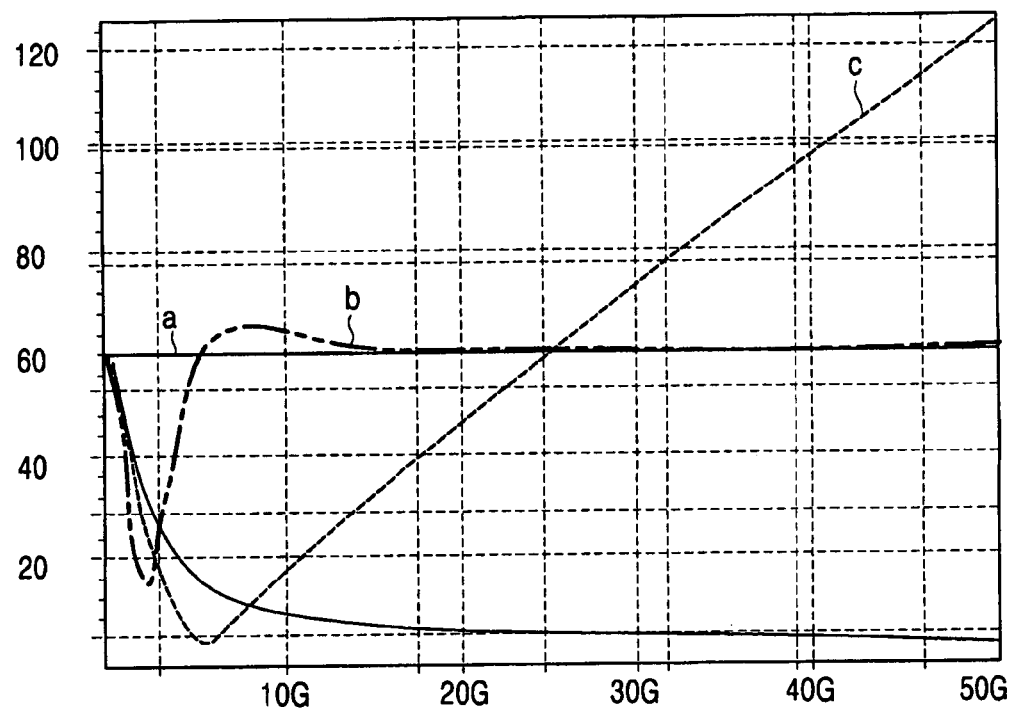
FIG. 4 illustrates a graph of changes in input impedance relative to frequency of different semiconductor devices.

FIG. 4 illustrates a graph of changes in input impedance Zin relative to frequency f of different semiconductor devices.

In FIG. 4, line a corresponds to an ideal case in which input impedance Zin of a semiconductor device is maintained completely constant. In FIG. 4, line b corresponds to the exemplary semiconductor device 100 according to one or more aspects of the invention and illustrated in FIG. 2. In FIG. 4, line c corresponds to a case in which a semiconductor device includes a terminal resistance, e.g., Rt, but does not include the resistor(s) R1-1 to R1-$n$, the capacitor(s) C1-1 to C1-$n$ and/or the inductor(s) L2-1 to L2-$n$, as described above. As may be seen it FIG. 4, embodiments of the invention, the semiconductor device 100 of FIGS. 1 and 2, which may include the resistor(s) R1-1 to R1-$n$, the capacitor(s) C1-1 to C1-$n$ and/or the inductor(s) L2-1 to L2-$n$ according to one or more aspects of the invention may achieve a constant and/or substantially constant impedance after passing through the resonant frequency twice.

In the exemplary embodiment illustrated in FIG. 1, the capacitors C1-1 to C1-$n$ and the resistors R1-1 to R1-$n$ are arranged in the semiconductor package 102, but embodiments of the invention are not limited thereto. For example, the capacitors C1-1 to C1-$n$ and the resistors R1-1 to R1-$n$ may be arranged outside the semiconductor device 100. For example, they may be arranged on a system board of a system to which a semiconductor device 100 is applied.

In embodiments, the signal input pins or the ground voltage pins may be replaced with signal input balls or ground voltage balls, respectively.

As described above, embodiments of the invention may provide a semiconductor device and a signal terminating method that may stably terminate a high speed input signal. Accordingly, it is possible to improve an operation performance of a system that includes a semiconductor device employing one or more aspects of the invention.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A semiconductor device, comprising:
   a semiconductor chip including a signal terminating resistor coupled between a signal input pad and a first ground voltage pad;
   a semiconductor package including a signal input terminal and a first ground voltage terminal, the signal input terminal being electrically coupled to the signal input pad of the semiconductor chip and the first ground voltage terminal being electrically coupled to the first ground voltage pad of the semiconductor chip;
   a capacitor and a resistor that are coupled between the signal input terminal and the first ground voltage terminal; and
   a first inductor realized by coupling the signal input terminal and the signal input pad.

2. The semiconductor device as claimed in claim 1, wherein the capacitor and the resistor are included in the semiconductor package.

3. The semiconductor device as claimed in claim 1, wherein a wire bond couples the signal input terminal and the signal input pad.

4. The semiconductor device as claimed in claim 1, wherein the semiconductor chip includes an input capacitor between the signal input pad and the first ground voltage pad.

5. The semiconductor device as claimed in claim 4, further comprising a second inductor realized by coupling the first ground voltage terminal and the first ground voltage pad.

6. The semiconductor device as claimed in claim 5, wherein a wire bond couples the first ground voltage terminal and the first ground voltage pad.

7. The semiconductor device as claimed in claim 6, wherein an inductance of the first inductor is smaller than an inductance of the second inductor.

8. The semiconductor device as claimed in claim 7, wherein the input impedance of the semiconductor device decreases from a value of the terminating resistor as a frequency increases to a first resonant frequency by the input capacitor and the second inductor, increases as the frequency increases from the first resonant frequency to a second resonant frequency by the capacitor and the second inductor, and decreases before maintaining a completely and/or substantially constant value corresponding to the value of the resistor as the frequency increases after the second resonant frequency.

9. The semiconductor device as claimed in claim 4, wherein:
   the semiconductor chip further includes a signal input portion adapted to receive a signal applied to the signal input pad, and
   the semiconductor package includes a second ground voltage terminal, and a third inductor realized by coupling the signal input portion and the second ground voltage terminal.

10. The semiconductor device as claimed in claim 9, wherein a wire bond couples the signal input portion and the second ground voltage terminal.

11. The semiconductor device as claimed in claim 4, wherein capacitance of the capacitor is smaller than capacitance of the input capacitor.

12. The semiconductor device as claimed in claim 11, wherein the input impedance of the semiconductor device decreases from a value of the terminating resistor as a frequency increases to a first resonant frequency by the input capacitor and the second inductor, increases as the frequency increases from the first resonant frequency to a second resonant frequency by the capacitor and the second inductor, and decreases before maintaining a completely and/or substantially constant value corresponding to the value of the resistor as the frequency increases after the second resonant frequency.

13. A signal terminating method of a semiconductor device including a semiconductor chip and a semiconductor package, the semiconductor chip including a signal terminating resistor coupled between a signal input pad and a first ground voltage pad, the semiconductor package including a signal input terminal and a first ground voltage terminal, the signal terminating method comprising:
- realizing a first inductor by coupling the signal input terminal and the signal input pad; and
- serially connecting a capacitor and a resistor between the signal input terminal and the first ground voltage terminal.

14. The signal terminating method of claim 13, further comprising, realizing a second inductor by coupling the first ground voltage pad of the semiconductor chip and the first ground voltage terminal of the semiconductor package.

15. The signal terminating method of claim 14, further comprising providing an input capacitor between the signal input pad and the first ground voltage pad.

16. The signal terminating method of claim 15, wherein the capacitor has a smaller capacitance value than the input capacitor.

17. The signal terminating method of claim 16, wherein the input impedance of the semiconductor device decreases from a value of the terminating resistor as a frequency increases to a first resonant frequency by the input capacitor and the second inductor, increases as the frequency increases from the first resonant frequency to a second resonant frequency by the capacitor and the second inductor, and decreases before maintaining a completely and/or substantially constant value corresponding to the value of the resistor as the frequency increases after the second resonant frequency.

18. The signal terminating method of claim 15, further comprising increasing an inductance value of the second inductor, wherein an inductance of the first inductor is smaller than an inductance of the second inductor.

19. The signal terminating method of claim 18, wherein the input impedance of the semiconductor device decreases from a value of the terminating resistor as a frequency increases to a first resonant frequency by the input capacitor and the second inductor, increases as the frequency increases from the first resonant frequency to a second resonant frequency by the capacitor and the second inductor, and decreases before maintaining a completely and/or substantially constant value corresponding to the value of the resistor as the frequency increases after the second resonant frequency.

20. The signal terminating method of claim 13, wherein the capacitor and the resistor are including in the semiconductor package.

* * * * *